(12) United States Patent
O'Dell et al.

(10) Patent No.: US 7,629,429 B2
(45) Date of Patent: Dec. 8, 2009

(54) SUBSTITUTED FLUORENE POLYMERS THEIR PREPARATION AND USES

(75) Inventors: Richard O'Dell, Taufkirchen (DE); Carl Towns, Stansted (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 981 days.

(21) Appl. No.: 10/477,037

(22) PCT Filed: May 10, 2002

(86) PCT No.: PCT/GB02/02179

§ 371 (c)(1),
(2), (4) Date: Apr. 1, 2004

(87) PCT Pub. No.: WO02/092724

PCT Pub. Date: Nov. 21, 2002

(65) Prior Publication Data

US 2004/0158017 A1    Aug. 12, 2004

Related U.S. Application Data

(60) Provisional application No. 60/315,623, filed on Aug. 29, 2001.

(30) Foreign Application Priority Data

May 11, 2001    (GB)    ................... 0111549.2

(51) Int. Cl.
*C08G 79/08*    (2006.01)
*H01J 1/62*    (2006.01)

(52) U.S. Cl. ........................... 528/4; 428/690; 428/917; 313/504; 313/506

(58) Field of Classification Search ................ 428/690, 428/917; 528/4, 308, 362, 330, 331, 344, 528/289, 294, 295, 298, 397; 257/E51.032, 257/40; 313/503, 506, 504
See application file for complete search history.

(56) References Cited

U.S. PATENT DOCUMENTS 4,539,507 A    9/1985    VanSlyke et al. ............ 313/504

(Continued)

FOREIGN PATENT DOCUMENTS

DE    19846767    4/2000

(Continued)

OTHER PUBLICATIONS

Kreyenschmidt et al., "Thermally Stable Blue-Light-Emitting Copolymers of Poly(alkylfluorene)," Macromolecules, 31:1099-1103 (1998).

(Continued)

*Primary Examiner*—D. Lawrence Tarazano
*Assistant Examiner*—Camie S Thompson
(74) *Attorney, Agent, or Firm*—Marshall, Gerstein & Borun LLP

(57) ABSTRACT

A polymer having a first repeat unit comprising a group having general formula (I) which is substituted or unsubstituted:

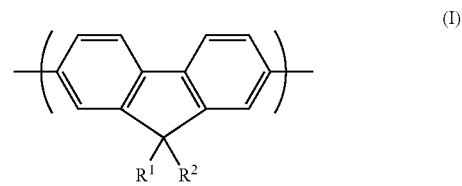

where at least one of $R^1$ or $R^2$ comprises at least two substituted or unsubstituted aryl or heteroaryl groups and excluding the group having general formula (I) where one or both of $R^1$ and $R^2$ comprises a triarylamine group.

32 Claims, 1 Drawing Sheet

U.S. PATENT DOCUMENTS

| | | | |
|---|---|---|---|
| 5,312,707 A | 5/1994 | Ota et al. | 430/59 |
| 5,621,131 A | 4/1997 | Kreuder et al. | 558/46 |
| 5,698,740 A | 12/1997 | Enokida et al. | 564/308 |
| 5,766,515 A | 6/1998 | Jonas et al. | 252/500 |
| 5,777,070 A | 7/1998 | Inbasekaran et al. | 528/394 |
| 5,962,631 A * | 10/1999 | Woo et al. | 528/397 |
| 6,353,083 B1 * | 3/2002 | Inbasekaran et al. | 528/295 |
| 6,444,334 B1 * | 9/2002 | Doi et al. | 428/690 |
| 6,514,632 B1 * | 2/2003 | Woo et al. | 428/690 |
| 6,653,438 B1 | 11/2003 | Spreitzer et al. | 528/394 |
| 6,861,502 B1 | 3/2005 | Towns et al. | 528/422 |
| 6,897,473 B1 | 5/2005 | Burroughes et al. | 257/40 |
| 6,900,285 B2 * | 5/2005 | Woo et al. | 528/373 |
| 2007/0154736 A1 * | 7/2007 | Cina | 428/690 |

FOREIGN PATENT DOCUMENTS

| | | |
|---|---|---|
| EP | 259 229 A1 | 3/1988 |
| EP | 0686662 | 12/1995 |
| EP | 0 842 208 | 5/2000 |
| EP | 0 707 020 | 8/2000 |
| EP | 1 088 875 A2 | 4/2001 |
| JP | 6107605 | 4/1994 |
| JP | 7145372 | 6/1995 |
| JP | 7301928 | 11/1995 |
| WO | WO 90/13148 | 11/1990 |
| WO | WO 99/20675 | 4/1999 |
| WO | WO 99/48160 | 9/1999 |
| WO | WO 99/54385 | 10/1999 |
| WO | WO 00/22026 | 4/2000 |
| WO | WO 00/46321 | 8/2000 |
| WO | WO 00/53656 | 9/2000 |
| WO | WO 00/55927 | 9/2000 |
| WO | WO 01/49769 | 7/2001 |
| WO | WO 02/26859 | 4/2002 |

OTHER PUBLICATIONS

"Novel Polymers Based on Poly(fluorine)s for LED Application", Lee et al., Part of the SPIE Conference on Organic Photonic Materials and Devices, pp. 1-12.

"Thermally, Stable, Blue Light Emitting Copolymers Derived From 2,7-Dibromo-9,9-Dialkylfluorenes", Miller et al., Polym. Prepr. (Am. Chem. Soc. Div. Polym. Chem.) 38(1), 1997, pp. 421-422.

"Polyfluorenes with Polyphenylene Dendron Side Chains: Toward Non-Aggregating, Light-Emitting Polymers", Setayesh et al., J. Am. Chem. Soc. 123, 2001, pp. 946-953.

International Search Report in PCT/GB02/02179 dated Jul. 18, 2002.

International Preliminary Examination Report in PCT/GB02/02179 dated May 22, 2003.

Search Report in GB 0111549.2 dated Nov. 1, 2001.

* cited by examiner

SUBSTITUTED FLUORENE POLYMERS THEIR PREPARATION AND USES

This is the U.S. national phase of International Application No. PCT/GB02/02179 filed May 10, 2002, the entire disclosure of which is incorporated herein by reference and the priority benefit under 35 U.S.C. § 119(e) of U.S. provisional application Ser. No. 60/315,623 filed Aug. 29, 2001, is hereby claimed.

The present invention relates to a polymer and uses thereof such as in an optical device, and to a process for preparing such a polymer.

Organic electroluminescent devices are known which employ an organic material for light emissions. For example, WO 90/13148 describes such a device comprising a semiconductor layer comprising a polymer film which comprises at least one conjugated polymer situated between electrodes. The polymer film in this case comprises a poly(para-phenylene vinylene) (PPV) which is capable of light emission when electrons and holes are injected therein. Other polymer layers capable of transporting holes or transporting electrons to the emissive layer may be incorporated into such devices.

For organic semiconductors important characteristics are the binding energies, measured with respect to the vacuum level of the electronic energy levels, particularly the "highest occupied molecular orbital" (HOMO) and the "lowest unoccupied molecular orbital" (LUMO) level. These can be estimated from measurements of photoemission and particularly measurements of the electrochemical potentials for oxidation and reduction. It is well understood in this field that such energies are affected by a number of factors, such as the local environment near an interface, and the point on the curve (peak) from which the value is determined. Accordingly, the use of such values is indicative rather than quantitative.

FIG. 1 shows a cross section of a typical device for emitting light. FIG. 2 shows the energy levels across the device. The anode 1 is a layer of transparent indium-tin oxide (ITO) with a work function of 4.8 electron volts. The cathode 2 is a LiAl layer with a work function of 2.4 electron volts. Between the electrodes is a light-emissive layer 3 of PPV, having a LUMO energy level 5 at around 2.7 electron volts and a HOMO energy level 6 at around 5.2 electron volts. Holes and electrons that are injected into the device recombine radiatively in the PPV layer. An important feature of the device is the hole transport layer 4 of polyethylene dioxythiophene (PEDOT). This polymer is disclosed in EP 0686662. This provides an intermediate energy level at about 4.8 electron volts which helps the holes injected from the ITO to reach the HOMO level in the PPV.

It should be noted here that value stated for energy levels, work functions etc. are generally illustrative rather than absolute. For example, the work function can vary widely. The applicants have carried out Kelvin probe measurements which suggest that 4.8 electron volts is a reasonable value. However, it is well known that the actual value can dependent on ITO deposition process and history.

Known device structures also may have an electron transport layer situated between a cathode 2 and the light emissive layer 3. This provides an intermediate energy level which helps the electrons injected from the cathode to reach the LUMO level of the material constituting the light-emissive layer. Suitably, the electron transporting layer has a LUMO energy level between the LUMO energy levels of the cathode and the light-emissive layer.

In terms of device efficiency, the efficiency of the electron transport material or layer is of great importance. As well as being an efficient electron transporter, an electron transport material also must have suitable device characteristics. That is to say, it must show good processability and lifetime in a device.

JP 07301928 discloses an electrophotographic photoreceptor. JP 7145372 discloses a hole transport material. JP 06107605 discloses a photoconductor for electro photography. All of these materials are small molecules and, thus, have the disadvantages associated with using small molecule layers in a device. None of these documents specifically are concerned with providing an improved electron transport material.

WO 99/54385 is particularly concerned with improving the light output at low drive voltage and efficiency of materials for use in an organic based light-emitting diode (page 1 lines 3 to 7). In this regard, this document discloses a copolymer comprising 10 to 90% wt of a fluorene group. The fluorene group is substituted in the 9 position by two $R^1$ groups. Only the embodiment where each $R^1$ is $C_8H_{17}$ is exemplified. According to page 2 line 18 to 21 of the description, the copolymers of WO 99/54385 can be used as light-emitting and/or hole transport layer materials in an electroluminescent device. This document is not concerned with providing an improved electron transport material.

Polym. Prepr. (1997) 38(1), 421-422 discloses blue light emitting copolymers of 9,9 di-n-hexylfluorene.

WO 00/22026 discloses blue-blue/green emitting polymers having improved morphological properties. A conjugated polymer containing fluorene structural elements having two different substituents in the C9 position is disclosed.

Whereas U.S. Pat. No. 5,777,070 is concerned with an improvement to the generally known 'Suzuki reaction' for making conjugated polymers, Example 7 applies this method to the preparation of a copolymer of 9,9-di-n-octylfluorene and 9,9-di-(4-methoxyphenyl)fluorene. WO 99/20675 is the corresponding International patent application to U.S. Pat. No. 5,777,070.

DE 19846767 discloses the preparation of a 9,9-diarylfluorene monomer in section c).

In this regard, one problem with known electron transport materials is their low thermal stability. Physical and conformational changes of materials (polymers) having low thermal stability during device operation leads to a shifting of the emission spectrum of the polymer. In other words, during device operation, the colour of emission from a polymer having low thermal stability is not constant or stable but can change. The glass transition temperature (Tg) value of a material is an indication of its thermal stability in a device. Materials having a high Tg value generally are more thermally stable in a device. Accordingly, for the purposes of improving efficiency, a charge transport material having a higher Tg value would be preferred because of its higher thermal stability.

In this regard, EP 1088875 purports to provide light-emitting polymers with good thermal stability. The good thermal stability is attributed to the incorporation of an adamantane spacer group in the polymers. A copolymer containing adamantane spacer groups is disclosed where the co-repeat unit is diphenylfluorene (polymer 66) or di(4-methoxyphenyl) fluorene (polymer 67). These two polymers are two of a 110 individualised polymers in EP 1088875.

J. Am. Chem. Soc. 2001, 123, 946-953 is concerned with polyfluorenes with dendron side chains. The purpose of the dendrons is to serve as solubilising groups and also to hinder aggregation. The dendron side chains are linked to C9 of the fluorene group by a $CH_2$ linking group. The protons of the $CH_2$ linking group are acidic and as such will contribute to instability of the polymer.

In view of the above, there still remains a need to provide an improved electron transport material insofar as it has improved device characteristics that will improve efficiency of the device and device lifetime.

Furthermore, a focus in the field of polymer OLEDs is the development of full colour displays for which red, green and blue emissive materials are required. For commercial applications, it is desirable for the OLED to have a lifetime of several thousand hours. One drawback with existing polymer OLED displays relevant to this development is the relatively short lifetime of blue emissive materials known to date. In view of the above, there still remains a need to provide electroluminescent materials, in particular blue electroluminescent materials, having improved lifetime.

Accordingly, it is an aim of the present invention to provide such a polymer.

It is a further aim of the present invention to provide a method for preparing such a polymer.

Still further, it is an aim of the present invention to provide uses of such a polymer in an optical device, such as, as an electron transport material or as an emissive material.

Accordingly, in a first embodiment of a first aspect of the present invention, there is provided a polymer having a first repeat unit comprising a group having general formula IV which is substituted or unsubstituted:

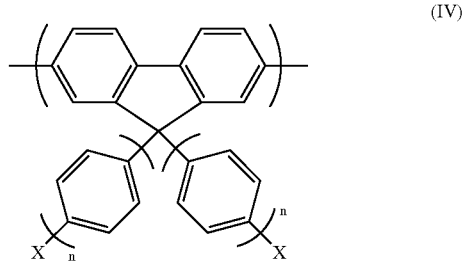

(IV)

where n is 1, 2 or 3 and X is hydrogen, or an alkyl, aryl, heteroaryl, alkoxy, arylalkyl, alkylaryl, cyano, halide, haloalkyl, haloaryl, haloheteroaryl or haloalkoxy. Preferably X is hydrogen or an alkyl group.

Preferably, in the polymer according to the first aspect, n is 1 and X is hydrogen or an alkyl group.

In one embodiment of the first aspect of the present invention, neither X is substituted or unsubstituted —(—N(aryl)$_2$, specifically neither X is —(—N(phenyl)$_2$.

In a second embodiment of the first aspect of the present invention, there is provided a polymer having a first repeat unit comprising a group having general formula I which is substituted or unsubstituted:

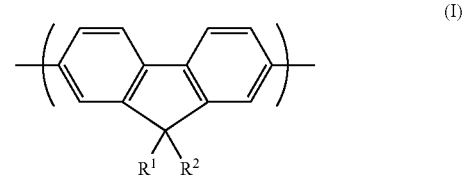

(I)

where at least one of $R^1$ or $R^2$ comprises at least two substituted or unsubstituted aryl or heteroaryl groups and excluding the group having general formula I where one or both of $R^1$ and $R^2$ comprises a triarylamine group.

Preferably, for ease of preparation, $R^1$ and $R^2$ are the same. However, $R^1$ and $R^2$ may be different.

In one embodiment, both $R^1$ and $R^2$ do not comprise a substituted or unsubstituted triarylamine.

Figure 1:
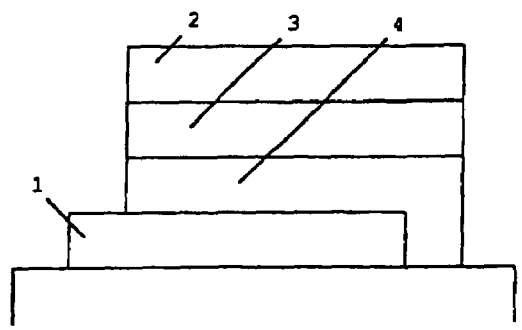
FIG. 1 shows a cross section of a typical device for emitting light.
Figure 2:
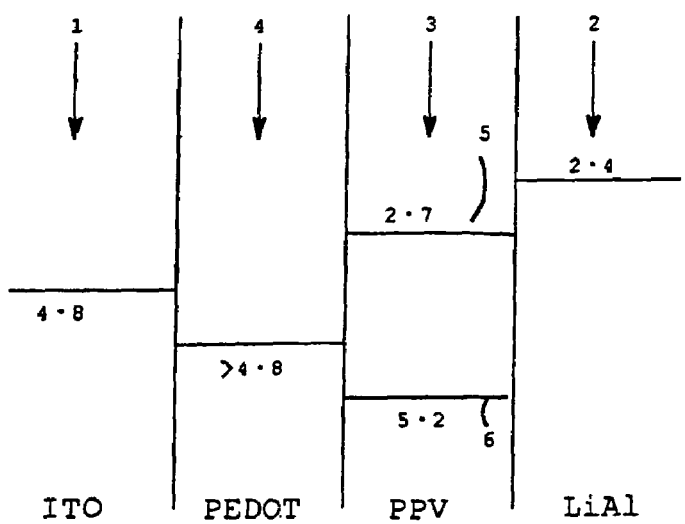
FIG. 2 shows the energy levels across the device.

Polymers according to the first aspect of this invention have superior thermal stability to polymers previously used as electron transport materials. This is evident from their higher Tg values. Tg is measured by Differential Scanning Calorimetry. As a specific example, a polymer comprising 80 mol % dioctylfluorene repeat units was measured to have a Tg of about 80° C. An analogous polymer having 9,9-di(biphenyl) fluorene repeat units in place of 30% of the dioctylfluorene repeat unit was measured to have a Tg of about 175° C. No appreciable shift in the emission spectrum of the polymer was observed by replacing the dioctylfluorene with 9,9-di(biphenyl)fluorene. In addition to the improved thermal stability afforded by materials according to the invention, the present inventors have also shown that incorporation of the Tg enhancing repeat units according to the invention into blue electroluminescent materials can increase the lifetime of an emissive material, in particular a blue electroluminescent material. By "blue electroluminescent material" is meant a material that by electroluminescence emits radiation having a wavelength in the range of 400-500 nm. more preferably 430-500 nm.

Furthermore, it has been established that polymers comprising a repeat unit according to the invention have a higher Tg than a corresponding polymer comprising fluorene repeat units wherein the or each 9 substituent comprises only one aryl substituents. In particular, a polymer comprising 30% 9,9-diphenylfluorene repeat units has a Tg of around 140° C. whereas an analogous polymer comprising 30% 9,9-di(biphenyl)fluorene repeat units (described above) has a Tg of around 175° C.

For the reasons discussed above, it is preferred that the Tg value of a polymer according to this invention is at least about >100° C., more preferably 100-230° C.

It is preferred that at least one of $R^1$ or $R^2$ comprises a substituted or unsubstituted phenyl, pyridine or thiophene groups.

Also for reasons of improving electron transport properties, it is preferred that at least one of $R^1$ and $R^2$ comprises a group having general formula II which is substituted or unsubstituted:

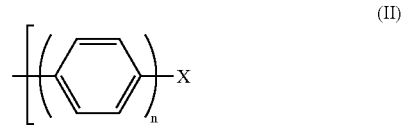

(II)

where n is 2 or 3 and X is selected from hydrogen, alkyl, aryl, heteroaryl, alkoxy, arylalkyl, alkylaryl, cyano, halide, haloalkyl, haloaryl, haloheteroaryl or haloalkoxy.

In this regard, it is preferred that the group having general formula I has a formula as shown in general formula III:

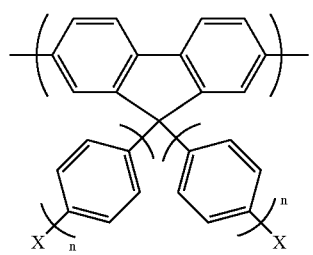

(III)

where X and each n independently are as defined above.

Particularly for ease of manufacture, it is preferred that X is selected from hydrogen, alkyl, haloalkyl or alkoxy. For similar reasons, it is further preferred that X is selected from methyl, ethyl, n-butyl, s-butyl or tertiary butyl.

Advantageously, n is 2. In this regard, at least one n may be 2 or both n may be 2. This is because this results in a polymer having a high Tg value and, thus, high thermal stability.

The polymer according to the present invention may comprise further a second repeat unit Ar which comprises a substituted or unsubstituted aryl or heteroaryl group. The ability to select Ar is an important feature, particularly in the design of an electroluminescent device. The structure of Ar may be selected to improve efficiency of a device by modulating the LUMO level of the conjugated backbone to help electron injection from the cathode to the light-emissive material. In this regard, it is preferred that Ar, which is substituted or unsubstituted, comprises a fluorene, phenylene, phenylene vinylene, benzothiadiazole, quinoxaline, thiophene, triarylamine, bis triarylamine or bis(diarylamine)arylene, particularly bis(diphenylamine)benzene groups. Polymers having a repeat unit Ar comprising a group selected from these preferred groups in combination with a first repeat unit as defined above have been found to have desirable properties such as good electron transport and good hole transport properties.

Optionally, the present polymer is soluble. In this regard, solubilising substituent groups can be included in the polymer in order to improve it's solubility. Alkyl and alkoxy groups in particular are preferred to improve solubility.

Broadly speaking, polymers according to the present invention include branched and linear polymers, homopolymers, copolymers and terpolymers. It is envisaged that HOMO polymers and copolymers in accordance with the present invention will be of particular interest with regard to their use in light emitting devices.

The degree of polymerisation of a polymer according to this invention preferably should be at least 4.

Preferred uses of a polymer according to the present invention include use as a component in an optical device, particularly an electroluminescent device. It is envisaged that the polymer will be of most use as an electron transport material The present invention further provides a monomer comprising a first repeat unit as defined above for transporting negative charge carriers in a polymer according to the present invention. In this regard, a copolymer may be defined to have been made from two or more different monomers. If the copolymer is a regular alternating copolymer, the polymer may be defined to have only one repeat unit. In other words, an AB regular alternating polymer which has been made from monomers A and B may be defined to have an AB repeat unit.

Monomers according to the present invention may be suitable for use in one or more of the polymerisation reactions described in general terms below. In this regard, preferably a monomer comprises one or more reactive groups and a repeat unit as defined in any aspect above. Preferred reactive groups include halide or reactive boron derivatives groups. In particular, bromine, boronic acid, boronic ester and borane groups are preferred.

Generally, several different polymerisation methods are known which may be used to manufacture polymers in accordance with the present invention.

One suitable method is disclosed in WO 00/53656. This describes a process for preparing a conjugated polymer, which comprises polymerising in a reaction mixture (a) an aromatic monomer having at least two boron derivative functional groups selected from a boronic acid group, a boronic ester group and a borane group, and an aromatic monomer having at least two reactive halide functional groups; or (b) an aromatic monomer having one reactive halide functional group and one boron derivative functional group selected from a boronic acid group, a boronic ester group and a borane group, wherein the reaction mixture comprises a catalytic amount of a catalyst suitable for catalysing the polymerisation of the aromatic monomers, and an organic base in an amount sufficient to convert the boron derivative functional groups into —$BX_3$ anionic groups, wherein X is independently selected from the group consisting of F and OH.

Another polymerisation method is disclosed in U.S. Pat. No. 5,777,070. Commonly, this process is known as "Suzuki Polymerisation". The process involves contacting monomers having two reactive groups selected from boronic acid, C1-C6 boronic acid ester, C1-C6 borane and combinations thereof with aromatic dihalide functional monomers or monomers having one reactive boronic acid, boranic acid ester or borane group and one reactive halide functional group with each other.

A further polymerisation method is known from "Macromolecules", 31, 1099-1103 (1998). The polymerisation reaction involves nickel-mediated coupling of dibromide monomers. This method commonly is known as "Yamamoto Polymerisation".

Accordingly, a second aspect of the present invention provides a process for preparing a polymer as defined in the first aspect of the present invention which comprises polymerising in a reaction mixture:

(a) a first aromatic monomer comprising either:
(i) a first repeat unit as defined in relation to the first aspect of the present invention; or
(ii) a second repeat unit which may be the same or different from the first repeat unit; and at least two reactive boron derivative groups selected from a boronic acid group, a boronic ester group and a borane group; and
(b) a second aromatic monomer comprising the other of the first or second repeat units and at least two reactive halide functional groups.

The second aspect of the present invention also provides a process for preparing a polymer as defined in the first aspect of the present invention which comprising polymerising in a reaction mixture:

(a) a first aromatic monomer comprising:
(i) a first repeat unit as defined in the first aspect of the present invention;
(ii) a reactive boron derivative group selected from a boronic acid group, a boronic ester group and a borane group; and
(iii) a reactive halide functional group; and (b) a second aromatic monomer comprising:
 (i) a second repeat unit that is the same or different from the first repeat unit;
 (ii) a reactive boron derivative group selected from a boronic acid group, a boronic ester group and a borane group; and
 (iii) a reactive halide functional group.

Still further, the second aspect of the present invention provides a process for preparing a polymer comprising a step of reacting a first monomer with a second monomer that may be the same or different from the first monomer under conditions so as to polymerise the monomer, the first monomer being a monomer for use in a polymerisation reaction and comprising one or more reactive groups and a monomeric unit having the structure of a first repeat unit as defined in the first aspect of the present invention.

The present invention further provides an optical device where a component therefore which comprises a substrate and a polymer according to the present invention supported on the substrate. Preferably, the optical device comprises an electroluminescent device. Such an electroluminescent device may comprise a first charge carrier injecting layer for injecting positive charge carriers, a second charge carrier injecting layer for injecting negative charge carriers, a light-emissive layer located between the charge carrier injecting layers for accepting and combining positive and negative charge carriers to generate light and a polymer according to the present invention for transporting negative charger carriers and either located between the second charge carrier injecting layer and the light emissive layer or located in the light-emissive layer. Where it is located in the light-emissive layer, it may be blended with a light-emissive material and optionally a positive charge transport material.

EXAMPLES

A) Monomer Preparation

Monomers according to the invention were prepared in accordance with the general scheme below:

Monomer Example M1

2,7-Dibromo-9,9-bis(biphenyl)fluorene
($R_1$=$R_2$=biphenyl)

(1) 2,7-Dibromofluorenone

In a 3 L flange flask fluorenone (100.006 g, 0.555 mol), phosphorus pentoxide (110.148 g, 0.776 mol) and trimethylphosphate (1200 mL) were mixed. Under mechanical stirring, a solution of bromine (63 mL, 1.23 mol) in trimethylphosphate (200 mL) was quickly added. This clear solution was then heated for 22 hours at 120° C. The mixture was allowed to cool to room temperature, then poured into 3 L of water. When sodium thiosulfate was added (50.045 g) the mixture turned yellow. Stirring was maintained for 1 hour, then the yellow solid was filtered. This solid was heated in methanol to remove the mono-brominated compound and gave 176.183 g (98% pure by HPLC, 94% yield).

$^1$H NMR (CDCl$_3$) 7.73 (2H, d, J 2.0), 7.61 (2H, dd, J 7.6, 2.0), 7.36 (2H, d, J 8.0) ; $^{13}$C NMR (CDCl$_3$) 142.3, 137.5, 135.3, 127.9, 123.3, 121.8, 109.8.

(2) 4,4'-Dibromo-2-carboxylic acid-1,1'-biphenyl

In a 2L flange flask 2,7-dibromofluorenone (120.526 g, 0.356 mol), potassium hydroxide (finely powdered flakes, 168.327 g, 3.000 mol) and toluene (600 mL) were placed. This mixture was heated at 120° C. for four hours then left to cool to room temperature. Water was added to dissolve the solid (~2L) under vigorous stirring. The greenish aqueous layer was removed and the yellow toluene layer was washed twice with water. The combined aqueous layers were acidified with concentrated hydrochloric acid then the precipitated solid was filtered, dried then recrystallised from toluene to give 100.547 g of off white crystals (79% yield).

$^1$H NMR ((CD$_3$)$_2$CO) 8.00 (1H, d, J 2.0), 7.77 (1H, dd, J 8.0, 2.4), 7.57 (2H, d, J 8.0), 7.34 (1H, d, J 8.4), 7.29 (2H, d, J 8.8); $^{13}$C NMR ((CD$_3$)$_2$CO) 167.1, 140.4, 139.8, 134.2, 133.5, 132.8, 132.7, 131.2, 130.6, 121.4, 121.1.

(3) 4,4'-Dibromo-2-methyl ester-1,1'-biphenyl 4,4-dibromo-2-carboxylic acid biphenyl (171.14 g, 0.481 mol) was suspended in methanol (700 mL) and sulfuric acid (15 mL) then heated at 80° C. for 21 hours. The solvent was removed and the oil was dissolved in ethyl acetate. This

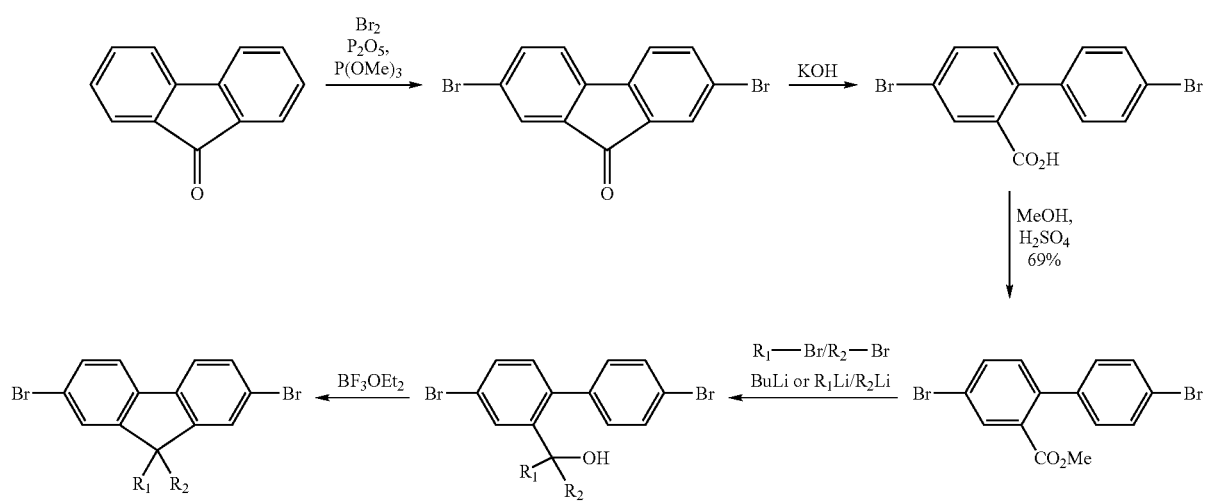

solution was washed with 2N sodium hydroxide, water, saturated sodium chloride, dried over magnesium sulfate, filtered and evaporated to give an orange oil. This oil was treated with hot methanol, on cooling the ester precipitated out and was filtered. The mother liquor was evaporated and the solid recrystallised giving additional product. The ester was 100% pure by GCMS, a yield of 123.27 g (69%) was obtained.

$^1$H NMR (CDCl$_3$) 7.99 (1H, d, J 2.0), 7.64 (1H, dd, J 8.0, 1.6), 7.51 (2H, d, J 8.4), 7.19 (1H, d, J 8.8), 7.13 (2H, d, J 8.8), 3.67 (3H, s); $^{13}$C NMR (CDCl$_3$) 167.1, 140.3, 139.1, 134.4, 132.9, 132.1, 132.0, 131.3, 129.8, 121.9, 121.5, 52.3.

GCMS: M$^+$=370

Literature ref: J.Am.Chem.Soc., 114, 15 (1992)

(4) 4,4'-Dibromo-2-bis(biphenyl) methyl alcohol Bipheny

4-Bromobiphenyl (63.766 g, 0.27 mol) was dissolved in dry THF (400 ml). The solution was then cooled to −65° C., at which point n-BuLi (109 ml, 2.5M in hexanes, 0.27 mol) was added dropwise with stirring. When the addition was complete the mixture was stirred at −65° C. for an hour. A solution of 4,4'-Dibromo-2-methyl ester biphenyl (39.14 g, 0.106 mol) in dry THF (200 ml) was added dropwise, with care being taken to keep the temperature of the mixture below −60° C. When the addition had been completed the mixture was allowed to warm to room temperature. The reaction was quenched with water (10 ml) and the solvent evaporated. The residue was then dissolved in toluene and washed with saturated ammonium chloride solution and brine. The solution was dried (MgSO$_4$) and evaporated; the product was then treated with petroleum ether (100-120° C.) and a little ethyl acetate. The resulting crystals were filtered and dried, giving 54.535 g (78%).

(5) 2,7-Dibromo-9,9-bis(biphenyl) fluorene

The alcohol (14.03 g, 21.7 mmol) was dissolved in dichloromethane (70 ml); the resulting solution was cooled with an ice bath. Boron trifluoride diethyletherate (14 ml) was added dropwise, giving a deep blue mixture. The mixture was poured into 2 liters of ice-water, potassium carbonate was added until the mixture was basic (pH 8). Dichloromethane was added and separated, the aqueous phase was then extracted with more dichloromethane. The organic phases were combined, filtered through celite and precipitated in methanol. The resulting solid was filtered and recrystallised several times from ethyl acetate/dichloromethane (50/50) to give 3.28 g (24% yield, 99.44% by HPLC)

Monomer Example M2

2,7-dibromo-9,9-bis(4-tert-butylbiphenyl)fluorene

The synthesis of monomer example M1 was followed except that 4-bromo-4'-tert-butyl-1,1'-biphenyl was used in place of 4-bromobiphenyl.

B) Polymer Preparation

Polymer Example P1

A blue emissive polymer according to the invention was prepared in accordance with the process of WO 00/53656 by reaction of 9,9-di-n-octylfluorene-2,7-di(ethylenylboronate) (0.5 equivalents), 2,7-dibromo-9,9-bis(biphenvlfluorene) (0.3 equivalents), N,N-di(4-bromophenyl)-sec-butylphenylamine (0.1 equivalents) and N,N'-di(4-bromophenyl)-N,N'-di(4-n-butylphenyl)-1,4-diaminobenzene (0.1 equivalents) to give polymer P1:

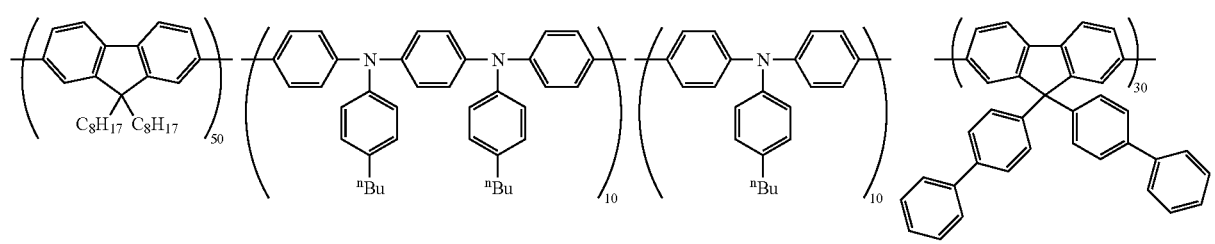

Polymer P1 has a Tg of 175° C.

Comparative Polymer Example

A blue electroluminescent polymer, as disclosed in WO 00/55927, was prepared in accordance with polymer example 1 wherein all 9,9-diphenylfluorene repeat units were replaced with 9,9-di-n-octylfluorene repeat units. This was done by following the preparation of polymer example 1 except that 0.3 equivalents of 2,7-dibromo-9,9-di-n-octylfluorene was used in place of 2,7-dibromo-9,9-diphenylfluorene.

The polymer according to this comparative example has a Tg of around 80° C.

C): Optical Device Example

Onto a glass substrate carrying an ITO substrate of thickness 270 microns was deposited by spin coating poly(ethylenedioxythiopene)/polystyrene sulfonate (available from Bayer™ as Baytron P™) to a thickness of 270 microns. Over this was deposited a polymer according to the invention to a thickness of 50 nm by spin coating. A layer of lithium fluoride (thickness 4 nm) was deposited onto the polymer by evaporation followed by a cathode of calcium (thickness 50 nm), again deposited by evaporation. The device was encapsulated using a metal can.

The lifetime of the device is around 3000 hours or more (by "lifetime" is meant the time for the brightness of the device to fall from 100 cd/m$^2$ to 50 cd/m$^2$ under DC drive at room temperature).

Comparative Device Example

A device analogous to the above optical device example was prepared except that the comparative polymer described above was used. The lifetime of this device is around 1000 hours.

Polymer P1 and the comparative polymer example are both blue electroluminescent polymers.

What is claimed is:

1. A polymer having a first repeat unit comprising a group having general formula I which is substituted or unsubstituted:

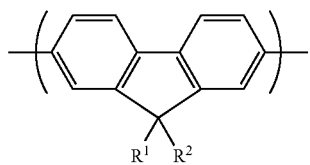
(I)

where both $R^1$ and $R^2$ comprise a substituent, at least one of $R^1$ and $R^2$ comprises a group having general formula II which is substituted or unsubstituted:

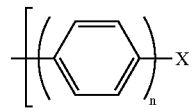
(II)

where n is 2 or 3 and X is selected from the group consisting of hydrogen, alkyl, aryl, heteroaryl, alkoxy, arylalkyl, alkylaryl, cyano, halide, haloalkyl, haloaryl, haloheteroaryl, and haloalkoxy, and excluding the group having general formula I where one or both of $R^1$ and $R^2$ comprises a triarylamine group.

2. A polymer according to claim 1, wherein $R^1$ and $R^2$ are the same.

3. A polymer according to claim 1, wherein $R^1$ and $R^2$ are different.

4. A polymer according to claim 1, wherein the other of $R^1$ and $R^2$ comprises a substituted or unsubstituted phenyl, pyridine, or thiophene group.

5. A polymer according to claim 1, wherein the group having general formula I has a formula as shown in general formula III:

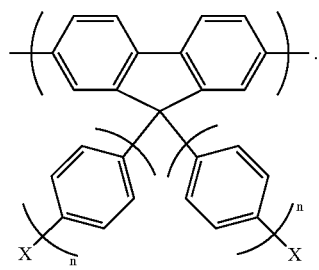
(III)

6. A polymer according to claim 5, where X is selected from the group consisting of hydrogen, alkyl, haloalkyl, and alkoxy.

7. A polymer according to claim 6, wherein X is selected from methyl, ethyl, n-butyl, s-butyl, and tertiary butyl.

8. A polymer according to claim 5, wherein n is 2.

9. A polymer according to claim 1, further having a second repeat unit Ar which comprises a substituted or unsubstituted aryl or heteroaryl group.

10. A polymer according to claim 9, wherein Ar is substituted or unsubstituted and comprises a group selected from the group consisting of fluorene, phenylene, phenylene vinylene, benzothiadiazole, quinoxaline, thiophene, triarylamine, bis triarylamine, and bis (diarylamine) arylene groups.

11. A polymer according to claim 1, comprising a homopolymer.

12. A polymer according to claim 1, comprising a copolymer.

13. A polymer according to claim 1, having a degree of polymerization of at least 4.

14. A polymer according to claim 1, having a Tg of at least 100° C.

15. A component in an optical device comprising a polymer according to claim 1.

16. A component according to claim 15, wherein the optical device comprises an electroluminescent device.

17. An optical device or a component therefor, which comprises a substrate and a polymer according to claim 1 supported on the substrate.

18. An optical device or a component therefor according to claim 17, wherein the optical device comprises an electroluminescent device.

19. An optical device according to claim 18, wherein the electroluminescent device comprises:
   a first charge carrier injecting layer for injecting positive charge carriers;
   a second charge carrier injecting layer for injecting negative charge carriers;
   a light-emissive layer located between the charge carrier injecting layers for accepting and combining positive and negative charge carriers to generate light; and
   a polymer according to claim 1 for transporting negative charge carriers and either located between the second charge carrier injecting layer and the light-emissive layer or located in the light-emissive layer.

20. A process for preparing a polymer according to claim 1 which comprises polymerizing in a reaction mixture:
   (a) a first aromatic monomer comprising either:
      (i) a first repeat unit comprising a group having general formula I which is substituted or unsubstituted:

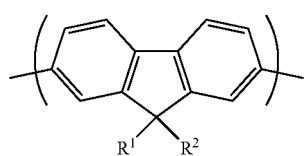
(I)

where both $R^1$ and $R^2$ comprise a substituent, at least one of $R^1$ and $R^2$ comprises a group having general formula II which is substituted or unsubstituted:

(II)

where n is 2 or 3 and X is selected from the group consisting of hydrogen, alkyl, aryl, heteroaryl, alkoxy, arylalkyl, alkylaryl, cyano, halide, haloalkyl, haloaryl, haloheteroaryl, and haloalkoxy, and excluding the group having general formula I where one or both of $R^1$ and $R^2$ comprises a triarylamine group; or (ii) a second repeat unit, and at least two reactive boron derivative groups selected from the group consisting of boronic acid groups, boronic ester groups and borane groups; and
(b) a second aromatic monomer comprising the other of the first or second repeat units and at least two reactive halide functional groups.

21. A process for preparing a polymer according to claim 1 which comprises polymerizing in a reaction mixture:
(a) a first aromatic monomer comprising:
(i) a first repeat unit comprising a group having general formula I which is substituted or unsubstituted:

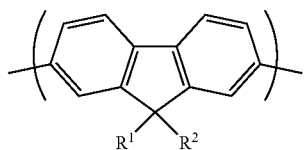

(I)

where both $R^1$ and $R^2$ comprise a substituent, at least one of $R^1$ and $R^2$ comprises a group having general formula II which is substituted or unsubstituted:

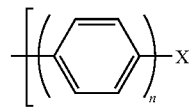

(II)

where n is 2 or 3 and X is selected from the group consisting of hydrogen, alkyl, aryl, heteroaryl, alkoxy, arylalkyl, alkylaryl, cyano, halide, haloalkyl, haloaryl, haloheteroaryl, and haloalkoxy, and excluding the group having general formula I where one or both of $R^1$ and $R^2$ comprises a triarylamine group;
(ii) a reactive boron derivative group selected from the group consisting of boronic acid groups, boronic ester groups, and borane groups; and
(iii) a reactive halide functional group; and
(b) a second aromatic monomer comprising
(i) a second repeat unit that is the same or different from the first repeat unit;
(ii) a reactive boron derivative group selected from the group consisting of boronic acid groups, boronic ester groups and borane groups and
(iii) a reactive halide functional group.

22. A polymer according to claim 1, where X is selected from the group consisting of hydrogen, alkyl, haloalkyl, and alkoxy.

23. A polymer according to claim 22, wherein X is selected from methyl, ethyl, n-butyl, s-butyl, and tertiary butyl.

24. A polymer according to claim 1, where X is alkyl.

25. A monomer for use in a polymerization reaction, comprising one or more reactive groups and a monomeric unit comprising a group having general formula (I) which is substituted or unsubstituted:

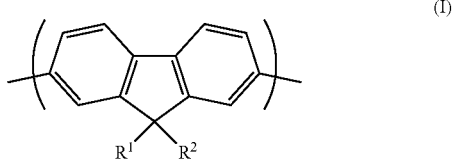

(I)

where both $R^1$ and $R^2$ comprise a substituent, at least one of $R^1$ and $R^2$ comprises a group having general formula II which is substituted or unsubstituted:

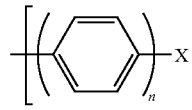

(II)

where n is 2 or 3 and X is selected from the group consisting of hydrogen, alkyl, aryl, heteroaryl, alkoxy, arylalkyl, alkylaryl, cyano, halide, haloalkyl, haloaryl, haloheteroaryl, and haloalkoxy, and excluding the group having general formula I where one or both of $R^1$ and $R^2$ comprises a triarylamine group.

26. A process for preparing a polymer comprising a step of reacting a first monomer according to claim 25 with a second monomer under conditions so as to polymerize the monomers.

27. A process according to claim 26, wherein the second monomer is the same as the first monomer.

28. A process according to claim 26, wherein the second monomer is different from the first monomer.

29. A process according to claim 20, wherein the second repeat unit is the same as the first repeat unit.

30. A process according to claim 20, wherein the second repeat unit is different from the first repeat unit.

31. A process according to claim 21, wherein the second repeat unit is the same as the first repeat unit.

32. A process according to claim 21, wherein the second repeat unit is different from the first repeat unit.

* * * * *

UNITED STATES PATENT AND TRADEMARK OFFICE
CERTIFICATE OF CORRECTION

PATENT NO. : 7,629,429 B2 Page 1 of 1
APPLICATION NO. : 10/477037
DATED : December 8, 2009
INVENTOR(S) : O'Dell et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1161 days.

Signed and Sealed this

Twenty-first Day of December, 2010

David J. Kappos
*Director of the United States Patent and Trademark Office*